United States Patent [19]
Chi et al.

[11] Patent Number: 6,111,286
[45] Date of Patent: Aug. 29, 2000

[54] LOW VOLTAGE LOW POWER N-CHANNEL FLASH MEMORY CELL USING GATE INDUCED DRAIN LEAKAGE CURRENT

[75] Inventors: Min-hwa Chi; Chih Ming Chen, both of Hsinchu, Taiwan

[73] Assignee: Worldwide Semiconductor Manufacturing Corporation, Hsinchu, Taiwan

[21] Appl. No.: 09/177,786

[22] Filed: Oct. 22, 1998

[51] Int. Cl.[7] .......................... H01L 29/76; H01L 29/788
[52] U.S. Cl. .......................... 257/315; 257/314; 257/316
[58] Field of Search ........................ 257/314–324; 438/257–264; 365/185

[56] References Cited

U.S. PATENT DOCUMENTS

| | | | |
|---|---|---|---|
| 5,350,938 | 9/1994 | Matsukawa et al. | 257/316 |
| 5,770,963 | 6/1998 | Akaogi et al. | 365/185.27 |
| 5,956,271 | 9/1999 | Kaya | 365/185.18 |
| 6,043,123 | 3/2000 | Wang et al. | 438/258 |

*Primary Examiner*—Minh Loan Tran
*Assistant Examiner*—Cuong Q Nguyen
*Attorney, Agent, or Firm*—Blakely, Sokoloff, Taylor & Zafman LLP

[57] ABSTRACT

A flash memory cell formed on a semiconductor substrate is disclosed. The cell comprises: a p-well formed in the substrate; a gate structure formed atop the p-well, the gate structure including a control gate and a floating gate, the floating gate electrically isolated from the control gate and the semiconductor substrate by a thin dielectric layer; an n– base formed adjacent to a first edge of the gate structure and extending underneath the gate structure; a p+ structure formed within the n– base and adjacent to the first edge of the gate structure; and a n+ structure adjacent a second edge of the gate structure. With such a structure, it is possible to program the cell by band-to-band tunneling enhanced hot electrons generated at the p+ surface. The erase is performed by Fowler-Nordheim tunneling through the n– base region.

3 Claims, 3 Drawing Sheets

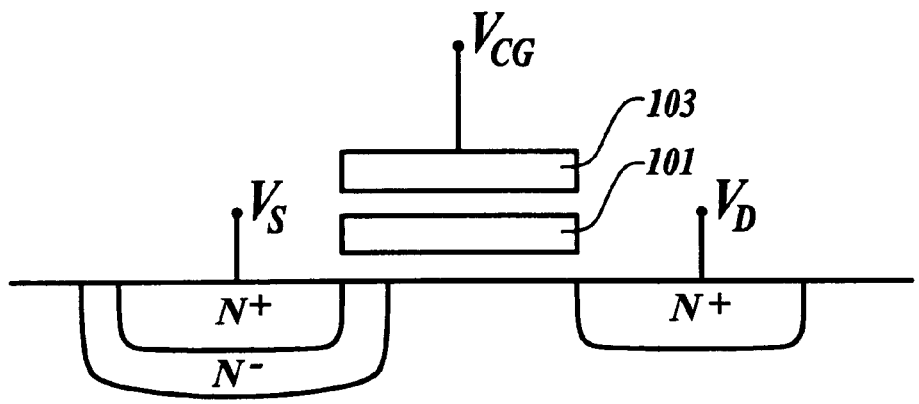
Fig. 1 *(PRIOR ART)*
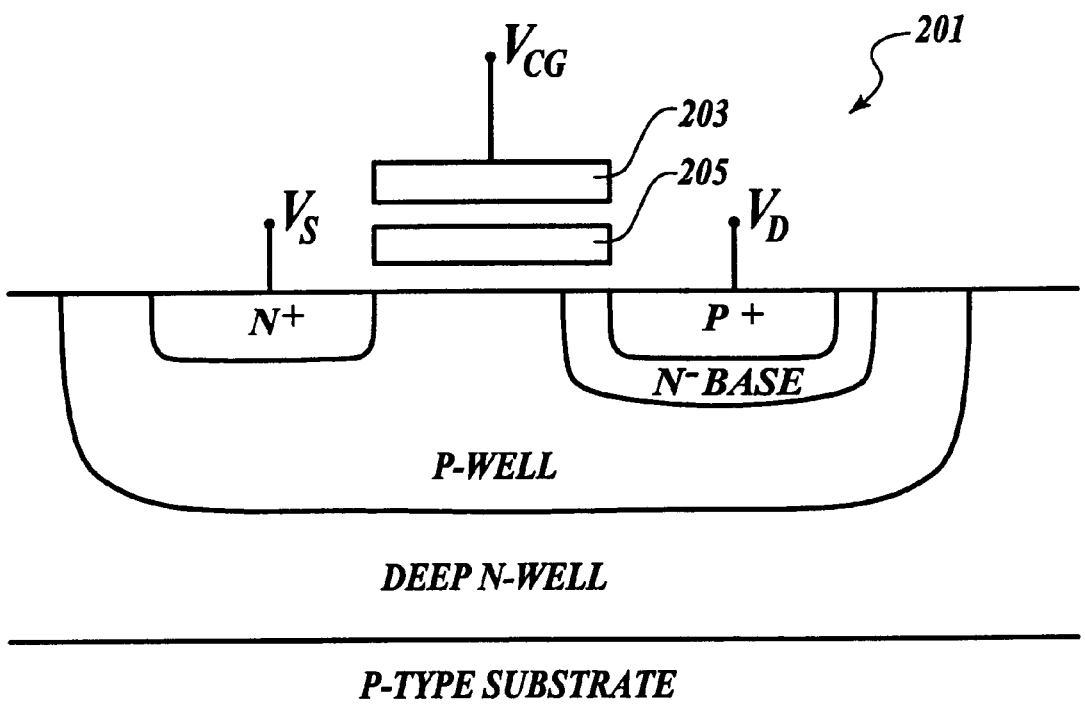
Fig. 2

6,111,286

LOW VOLTAGE LOW POWER N-CHANNEL FLASH MEMORY CELL USING GATE INDUCED DRAIN LEAKAGE CURRENT

FIELD OF THE INVENTION

The present invention is directed towards flash memory, and more particularly, to a flash memory cell using gate induced drain leakage (GIDL) current.

BACKGROUND OF THE INVENTION

Toward the end of the 1980s, the semiconductor industry developed the electrically erasable PROM (EEPROM). The result was a new generation of memories targeted at the low-cost, high-density memory market. The term "flash" historically had been used to describe a mode of erasing an entire memory array in a short duration of time, such as one second. Typically, flash memory is programmed by hot electron injection at the drain edge and erased by Fowler-Nordheim tunneling from the source.

Flash memory is classified as nonvolatile memory because a memory cell in the flash memory can retain the data stored in the memory cell without periodic refreshing. Most prior art flash memory can store a single bit in a memory cell. In other words, the memory cell can either store a "1" or a "0."

A prior art flash memory cell is shown in FIG. 1. The memory cell includes a double stack of polysilicon forming a floating gate 101 and a control gate 103. The source side is biased to a voltage $V_s$ and is doubly implanted with an n+ structure formed within an n− base. Typically, the n+ structure on the source side is implanted with arsenic at a dose of $10^{16}/cm^2$. The n− base on the source side is doped with phosphorous at a dose of $10^{14}/cm^2$. The drain side n+ structure is biased to a voltage $V_d$ and is doped with arsenic to a dose of $10^{16}/cm^2$. Typically, the drain side does not have a lightly doped drain structure, which will tend to reduce the electrical field near the drain side and degrade the generation of hot electrons during programming. A tunnel oxide is placed between the substrate and the floating gate 101. The tunnel oxide is typically 80–120 angstroms thick.

Programming of the prior art flash memory cell of FIG. 1 is performed by channel hot electron injection. During the programming operation, the drain voltage $V_d$ is typically biased to 7 volts, the control gate voltage $V_{cg}$ is biased to 9–12 volts, and the source voltage $V_s$ is grounded. Hot electrons are injected toward the floating gate 101 during programming. One drawback of channel hot electron injection programming is low injection efficiency and the relatively large power consumption during programming. Note also that large voltage biases are necessary to achieve programming.

During the erase operation, Fowler-Nordheim tunneling is used through the source side. The bias during the erase function is typically 0 volts for the drain voltage $V_d$, 9–12 volts for the source voltage $V_s$, and the control gate voltage $V_{cg}$ varies between −9 volts to 0 volts. Thus, a large electric field can be established across the tunnel oxide between the floating gate 101 and the source overlap area of the n− base. Electrons on the floating gate 101 will tunnel into the source n+ structure and be removed.

However, as noted above, the prior art flash memory cell requires relatively high voltage biasing on the terminals of the memory cell which results in relatively high power consumption. Therefore, what is needed is a flash memory cell that can operate with low voltage and low power consumption.

SUMMARY OF THE INVENTION

A flash memory cell formed on a semiconductor substrate is disclosed. The cell comprises: a p-well formed in said substrate; a gate structure formed atop said p-well, said gate structure including a control gate and a floating gate, said floating gate electrically isolated from said control gate and said semiconductor substrate by a thin dielectric layer; an n− base formed adjacent to a first edge of said gate structure and extending underneath said gate structure; a p+ structure formed within said n− base and adjacent to said first edge of said gate structure; and a n+ structure adjacent a second edge of said gate structure. With such a structure, it is possible to program the cell by band-to-band tunneling enhanced hot electrons generated at the p+ surface. The erase is performed by Fowler-Nordheim tunneling through the n− base region.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1 is a cross-sectional view of a prior art flash memory cell;

FIG. 2 is a cross-sectional view of a semiconductor substrate illustrating a flash memory cell formed in accordance with the present invention;

DETAILED DESCRIPTION OF THE PREFERRED EMBODIMENT

Figure 3:
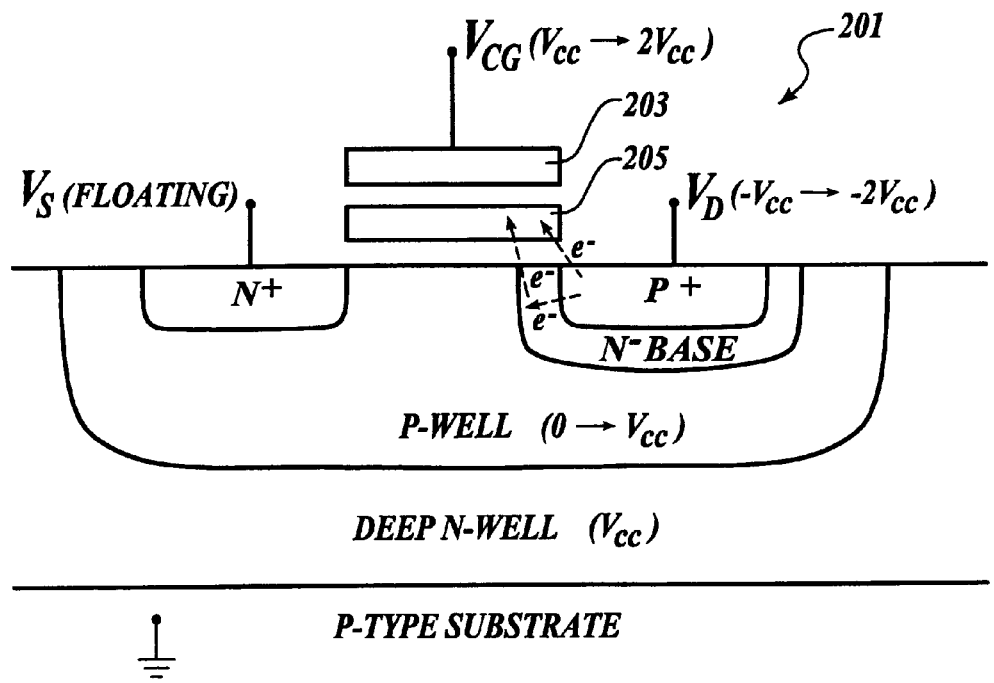
FIG. 3 is a cross-section view of the flash memory cell of FIG. 2 illustrating the programming method.

As seen in FIG. 2, the preferred embodiment of the present invention is shown comprising an n-channel flash memory cell 201. The flash memory cell 201 includes a control gate 203 and a floating gate 205 formed atop a semiconductor substrate. The floating gate 205 is surrounded by an insulating dielectric, commonly silicon dioxide. The floating gate 205 is separated from the substrate surface by a thin gate oxide on the order of between 50 to 100 angstroms thick. The formation of the floating gate 205 and the control gate 203 is substantially similar to the prior art shown in FIG. 1 and will not be further described in detail.

For the n-channel flash memory cell 201 of the present invention, in the preferred embodiment, a deep n-well is formed within a p-type semiconductor substrate. The deep n-well is formed using conventional diffusion or ion implantation techniques. The deep n-well preferably has a depth of 3 microns and has a dopant concentration of $10^{15}/cm^3$.

Formed within the deep n-well is a p-well. The p-well is formed using conventional diffusion or ion implantation techniques. The p-well preferably has a depth of 1.5 microns and a dopant concentration of $10^{16}/cm^3$. As can be seen, the control gate 203 and the floating gate 205 rest atop the p-well.

On the source side of the floating gate 205 and control gate 203 is an n+ structure. Preferably, the n+ structure is self-aligned to the source side edge of the floating gate 205 and control gate 203. The n+ structure is preferably formed using ion implantation to a depth of 0.3 microns and having a dopant concentration (preferably arsenic ions) of about $10^{20}/cm^3$.

Also formed within the p-well is an n– base structure that is formed on the drain side of the floating gate 205 and control gate 203. The n– base extends underneath the floating gate 205. Preferably, this can be accomplished using self-aligned ion implantation followed by thermal diffusion of the n-type dopants (typically phosphorous) such that the n-type dopant laterally diffuses underneath the floating gate 205. Further, preferably using the same mask as used to form the n– base, a p+ structure is formed within the n– base and self-aligned to the drain side of the control gate 203 and floating gate 205. Preferably, the p+ structure has a depth of 0.3 microns and a dopant concentration (for example boron ions) of $10^{20}/cm^3$. Further, preferably, the n– base structure has a depth of 0.7 microns and a dopant concentration of $10^{17}/cm^3$.

Metal interconnections are then made to the various structures of the flash memory cell 201 using conventional techniques. Specifically, a source connection is made to the n+ structure, a drain connection is made to the p+ structure, and a control gate connection is made to the control gate 203. In that way, a voltage $V_s$ can be applied to the n+ structure, a voltage $V_d$ can be applied to the p+ structure, and a voltage $V_{cg}$ can be applied to the control gate 203.

From FIG. 2, it can be seen that a vertical bipolar structure (i.e., p+/n– base/p-well bipolar) is formed at the drain side. The n– base region is a key element of the flash cell 201. First, the n– base serves as the drain for the n-channel flash cell 201 during read operation. Second, the n– base serves as an isolation region so that hot electrons generated from GIDL current during programming can be redirected by the favored electrical field toward the floating gate which results in fast programming. Third, the n– base also serves as an erase area with a small coupling ratio to the floating gate so that fast erase operation can result. The GIDL current on the surface of the n– base is negligible due to its lower doping level than the n+ structure.

Figure 4:
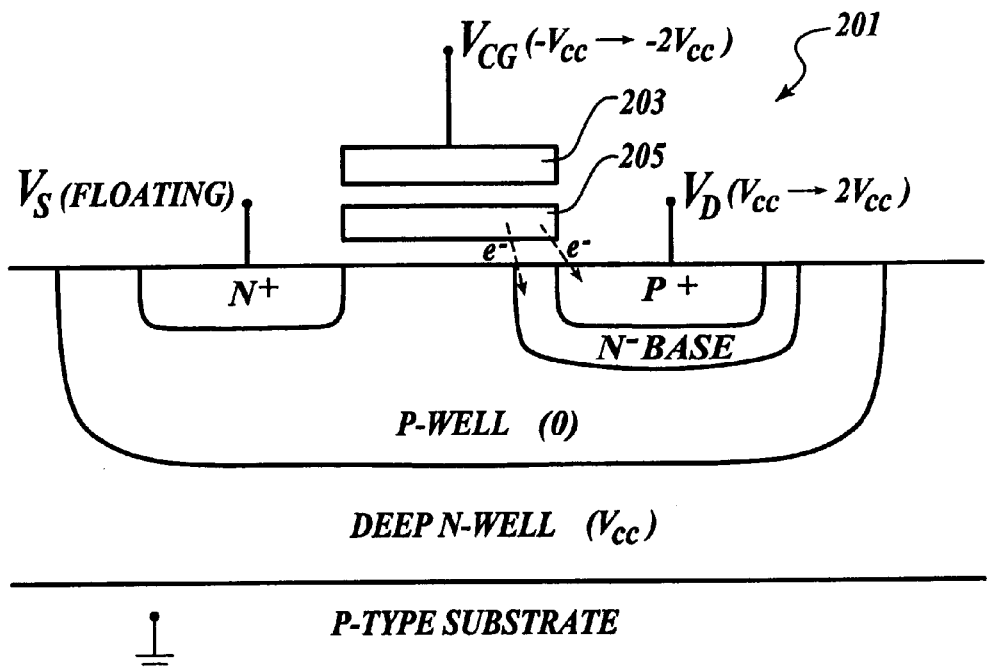
FIG. 4 is a cross-section view of the flash memory cell of FIG. 2 illustrating the erase operation.
Figure 5:
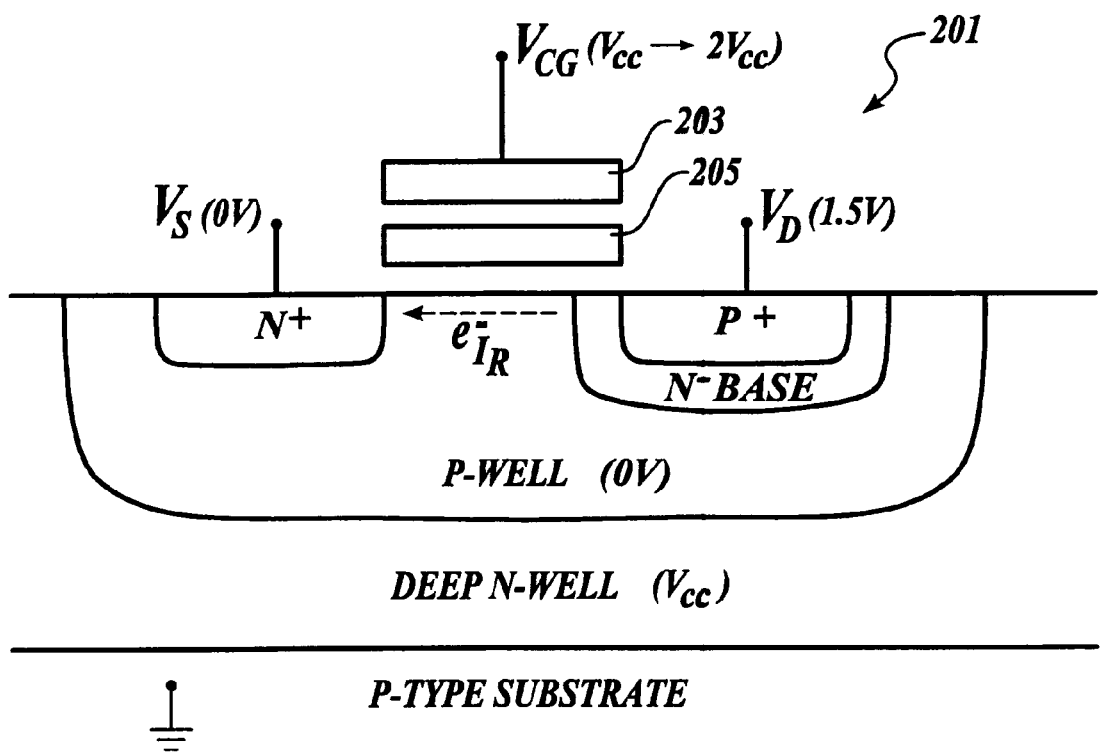
FIG. 5 is a cross-section view of the flash memory cell of FIG. 2 illustrating the read operation.

The operation of the flash memory cell 201 is seen in FIGS. 3–5. Turning to FIG. 3, the voltages applied to the various connections and structures of the flash memory cell 201 for the programming operation is shown. The programming method is based upon band-to-band tunneling enhanced hot electron generation (BBHE) as well as Fowler-Nordheim tunneling. The preferred bias during programming is: $V_d$ is biased to between $-V_{cc}$ and $-2V_{cc}$; n– base is floating; $V_{cg}$ biased to between $V_{cc}$ and $2V_{cc}$; $V_s$ is floating; $V_{pw}$ is biased to between 0 and $V_{cc}$; deep n-well biased to $V_{cc}$; and the p-type substrate biased to ground. Preferably, $V_{cc}$ is approximately 2.5 or 3.3 volts.

Under these biasing conditions, electrons are generated on the surface of the p+ structure underneath the floating gate 205 by band-to-band tunneling. These band-to-band tunneling generated electrons may tunnel through the tunnel oxide toward the floating gate 205 by Fowler-Nordheim tunneling if the electrical field across the tunneling oxide is sufficiently large (approximately 10 MV/cm). These band-to-band tunneling generated electrons may also flow into the n– base region and generate hot electrons by gaining energy through the junction electric field and/or impact ionization. The hot electrons can overcome the barrier and be injected towards the floating gate 205 with the aid of the positive bias on the control gate 203. In summary, the programming current is generated by two mechanisms: (1) Fowler-Nordheim tunneling directly from the p+ structure into the floating gate 205 and (2) hot electron injection from the p+ structure through the n– base into the floating gate 205. The mechanism that generates most of the current to the floating gate 205 depends upon the bias applied to the control gate, the p-well, and the p+ structure.

Note that the n– base is forward biased with respect to the p-well during programming by the band-to-band tunneling electron current. The n– base potential is clamped to the same voltage as the p-well by a one diode voltage drop. The reverse bias p+/n– base structure provides a large electric field for generation of band-to-band tunneling hot electrons by impact ionization. The bipolar action of the p-well/n–base/p+ structure is negligible, since the p-well injection efficiency is small due to its lower doping level than the n– base doping level.

Moreover, note that the band-to-band hot electron mechanism can be implemented only on a p-channel cell. In the preferred embodiment, with an n– base at the drain side, it is therefore possible to apply band-to-band hot electron current for programming of n-channel cells.

Turning next to FIG. 4, the erase operation of the flash memory cell 201 is illustrated. The preferred bias for the erase operation is as follows: $V_s$ and the n– base are floating; $V_{cg}$ is biased to between $-V_{cc}$ and $-2V_{cc}$; $V_d$ is biased to between $V_{cc}$ and $2V_{cc}$; the p-well is biased to 0 volts; the deep n-well is biased to $V_{cc}$; and the p-type substrate is biased to ground. The potential of the n– base is clamped to the p+ structure by the forward biased p+/n– base junction. Since the coupling ratio from the p+ structure and the n– base to the floating gate is very small, there is a large electrical field established across the tunnel oxide between the floating gate 205 and the p+/n– base region to trigger Fowler-Nordheim tunneling. The electrons on the floating gate 205 will be tunneling into the p+/n– base region and removed away.

Note that the p+/n– base/p-well bipolar transistor at the drain side may be turned on during erase operation and may result in undesirable current transients at the drain. The bipolar action can be eliminated by designing the doping of the n– base low enough, so that the entire n– base can be depleted by the bias between the p+ drain and the p-well. Certainly if the n– base is shorted to the p+ structure during erase, the bipolar action is eliminated.

The read operation of the flash memory cell 201 is shown in FIG. 5. The preferred bias for the read operation is: $V_d$ approximately 1.5 volts; $V_{cg}$ approximately to $V_{cc}$; $V_s$ approximately to 0 volts; p-well to 0 volts; n– base floating; deep n-well to $V_{cc}$; and p-type substrate to ground. The n– base potential is one diode voltage drop (typically approximately 0.5 volts) below $V_d$ during the read operation. The channel may be inverted or not (depending on the absence or presence of net electron charge on the floating gate) so that the magnitude of the read current $i_r$ denotes the digital information stored in the flash cell 201. Note that with the floating n– base, the p+/n– base/p-well bipolar transistor may be turned on during read and may result in undesirable leakage current. One way to eliminate the turn-on of the bipolar transistor is to short the n– base to the p+ structure during read operation.

There are several advantages of the flash memory cell 201 of the present invention. First, programming by band-to-band hot electron and Fowler-Nordheim tunneling is faster than channel hot electron injection. The band-to-band hot electron injection efficiency is known to be larger than conventional channel hot electron injection. Further, the band-to-band hot electron injection does not need large channel current during programming. Thus, not only is the speed of the programming enhanced, the power consumption during programming is reduced significantly.

Second, erasing by Fowler-Nordheim tunneling through the p+ structure n− base at the drain side is effective and low power consumption is similar to the conventional source side Fowler-Nordheim erase. The n− base doping is lower than conventional n+ junction, and thus there is a negligible band-to-band tunneling induced leakage current during erase. It is known that GIDL current at the source side in conventional flash memory cells would degrade the oxide and may present a limit for future scaled cells. The flash memory cell 201 of the present invention eliminates GIDL degradation and can be scaled for future advanced cell structures.

Note also that the flash memory cell 201 of the present invention cannot form a p-channel flash cell by inverting the polarities of the conduction types and voltage biases. This is because hole injection through the tunnel oxide not only will degrade tunnel oxide but is also very ineffective due to the larger energy barrier for holes at the oxide interface. Therefore, a corresponding p-channel cell is not useful.

While the preferred embodiment of the invention has been illustrated and described, it will be appreciated that various changes can be made therein without departing from the spirit and scope of the invention.

What is claimed is:

1. A flash memory cell formed on a semiconductor substrate comprising:

a p-well formed in said substrate;

a gate structure formed atop said p-well, said gate structure including a control gate and a floating gate, said floating gate electrically isolated from said control gate and said semiconductor substrate by a thin dielectric layer;

an n− base formed adjacent to a first edge of said gate structure and extending underneath said gate structure;

a p+ structure formed within said n− base and adjacent to said first edge of said gate structure; and a n+ structure adjacent a second edge of said gate structure;

wherein said p+ structure is connected to a voltage source $V_d$, said n+ structure is connected to a voltage source $V_s$, and said control gate is connected to a voltage source $V_{cg}$;

further wherein said p-well is formed within a deep n-well formed in a p-type substrate, said deep n-well biased to a voltage $V_{cc}$, and said p-type substrate grounded;

further wherein in order to perform the write operation: $V_d$ is biased to $-V_{cc}$, $V_s$ is floating, $V_{cg}$ is biased to $V_{cc}$.

2. A flash memory cell formed on a semiconductor substrate comprising:

a p-well formed in said substrate;

a gate structure formed atop said p-well, said gate structure including a control gate and a floating gate, said floating gate electrically isolated from said control gate and said semiconductor substrate by a thin dielectric layer;

an n− base formed adjacent to a first edge of said gate structure and extending underneath said gate structure;

a p+ structure formed within said n− base and adjacent to said first edge of said gate structure; and a n+ structure adjacent a second edge of said gate structure;

wherein said p+ structure is connected to a voltage source $V_d$, said n+ structure is connected to a voltage source $V_s$, and said control gate is connected to a voltage source $V_{cg}$;

further wherein said p-well is formed within a deep n-well formed in a p-type substrate, said deep n-well biased to a voltage $V_{cc}$, and said p-type substrate grounded;

further wherein in order to perform the erase operation: $V_d$ is biased to $V_{cc}$, $V_s$ is floating, $V_{cg}$ is biased to $-V_{cc}$.

3. A flash memory cell formed on a semiconductor substrate comprising:

a p-well formed in said substrate;

a gate structure formed atop said p-well, said gate structure including a control gate and a floating gate, said floating gate electrically isolated from said control gate and said semiconductor substrate by a thin dielectric layer;

an n− base formed adjacent to a first edge of said gate structure and extending underneath said gate structure;

a p+ structure formed within said n− base and adjacent to said first edge of said gate structure; and a n+ structure adjacent a second edge of said gate structure;

wherein said p+ structure is connected to a voltage source $V_d$, said n+ structure is connected to a voltage source $V_s$, and said control gate is connected to a voltage source $V_{cg}$;

further wherein said p-well is formed within a deep n-well formed in a p-type substrate, said deep n-well biased to a voltage $V_{cc}$, and said p-type substrate grounded;

further wherein in order to perform the read operation: $V_d$ is biased to 1.5 volts, $V_s$ is grounded, $V_{cg}$ is biased to $V_{cc}$.

* * * * *